United States Patent
Pax et al.

(10) Patent No.: US 7,242,213 B2
(45) Date of Patent: *Jul. 10, 2007

(54) MEMORY MODULE AND METHOD HAVING IMPROVED SIGNAL ROUTING TOPOLOGY

(75) Inventors: George E. Pax, Boise, ID (US); Roy E. Greeff, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/932,477

(22) Filed: Sep. 1, 2004

(65) Prior Publication Data

US 2005/0030797 A1  Feb. 10, 2005

Related U.S. Application Data

(63) Continuation of application No. 10/460,588, filed on Jun. 11, 2003.

(51) Int. Cl.
*H03K 19/03* (2006.01)
*H01L 21/8242* (2006.01)
*H01L 25/00* (2006.01)
*G11C 7/08* (2006.01)

(52) U.S. Cl. .......................... 326/30; 326/83; 438/253; 365/194; 327/565

(58) Field of Classification Search ................ 326/30, 326/83, 86, 85, 80; 438/253; 365/194; 327/565

See application file for complete search history.

(56) References Cited

U.S. PATENT DOCUMENTS

| 3,742,253 A | 6/1973 | Kronies ..................... 307/247 |
| 4,045,781 A | 8/1977 | Levy et al. ................. 364/200 |
| 4,240,143 A | 12/1980 | Besemer et al. ............ 364/200 |

(Continued)

FOREIGN PATENT DOCUMENTS

EP  0849685 A2  6/1998

(Continued)

OTHER PUBLICATIONS

Intel, "Flash Memory PCI Add-In Card for Embedded Systems", Application Note AP-758, Sep. 1997, pp. i-13.

(Continued)

*Primary Examiner*—Rexford Barnie
*Assistant Examiner*—Lam T. Mai
(74) *Attorney, Agent, or Firm*—Dorsey & Whitney, LLP.

(57) ABSTRACT

A registered memory module includes several memory devices coupled to a register through a plurality of transmission lines forming a symmetrical tree topology. The tree includes several branches each of which includes two transmission lines coupled only at its ends to either another transmission line or one of the memory devices. The branches are arranged in several layers of hierarchy, with the transmission lines in branches having the same hierarchy having the same length. Each transmission line preferably has a characteristic impedance that is half the characteristic impedance of any pair of downstream transmission lines to which it is coupled to provide impedance matching. A dedicated transmission line is used to couple an additional memory device, which may or may not be an error checking memory device, to the register.

84 Claims, 3 Drawing Sheets

U.S. PATENT DOCUMENTS

| | | | |
|---|---|---|---|
| 4,245,306 A | 1/1981 | Besemer et al. | 364/200 |
| 4,253,144 A | 2/1981 | Bellamy et al. | 364/200 |
| 4,253,146 A | 2/1981 | Bellamy et al. | 364/200 |
| 4,443,845 A | 4/1984 | Hamilton et al. | 364/200 |
| 4,608,702 A | 8/1986 | Hirzel et al. | 375/110 |
| 4,707,823 A | 11/1987 | Holdren et al. | 370/1 |
| 4,724,520 A | 2/1988 | Athanas et al. | 364/200 |
| 4,813,772 A | 3/1989 | Kowel et al. | 350/388 |
| 4,831,520 A | 5/1989 | Rubinfeld et al. | 364/200 |
| 4,891,808 A | 1/1990 | Williams | 370/112 |
| 4,930,128 A | 5/1990 | Suzuki et al. | 371/12 |
| 4,953,930 A | 9/1990 | Ramsey et al. | 350/96.11 |
| 5,241,506 A | 8/1993 | Motegi et al. | 365/210 |
| 5,243,703 A | 9/1993 | Farmwald et al. | 395/325 |
| 5,251,303 A | 10/1993 | Fogg, Jr. et al. | 395/275 |
| 5,269,022 A | 12/1993 | Shinjo et al. | 395/700 |
| 5,307,381 A | 4/1994 | Ahuja | 375/107 |
| 5,313,590 A | 5/1994 | Taylor | 395/325 |
| 5,317,752 A | 5/1994 | Jewett et al. | 395/750 |
| 5,319,755 A | 6/1994 | Farmwald et al. | 395/325 |
| 5,327,553 A | 7/1994 | Jewett et al. | 395/575 |
| 5,355,391 A | 10/1994 | Horowitz et al. | 375/36 |
| 5,379,382 A | 1/1995 | Work et al. | 395/275 |
| 5,432,823 A | 7/1995 | Gasbarro et al. | 375/356 |
| 5,432,907 A | 7/1995 | Picazo, Jr. et al. | 395/200 |
| 5,442,770 A | 8/1995 | Barratt | 395/403 |
| 5,461,627 A | 10/1995 | Rypinski | 370/95.2 |
| 5,465,229 A | 11/1995 | Bechtolsheim et al. | 345/477 |
| 5,479,370 A | 12/1995 | Furuyama et al. | 365/189.12 |
| 5,497,476 A | 3/1996 | Oldfield et al. | 395/439 |
| 5,502,621 A | 3/1996 | Schumacher et al. | 361/760 |
| 5,544,319 A | 8/1996 | Acton et al. | 395/200.07 |
| 5,566,325 A | 10/1996 | Bruce, II et al. | 395/494 |
| 5,577,220 A | 11/1996 | Combs et al. | 395/416 |
| 5,581,767 A | 12/1996 | Katsuki et al. | 395/800 |
| 5,606,717 A | 2/1997 | Farmwald et al. | 395/856 |
| 5,608,264 A | 3/1997 | Gaul | 357/734 |
| 5,623,534 A | 4/1997 | Desai et al. | 379/59 |
| 5,638,334 A | 6/1997 | Farmwald et al. | 365/230.03 |
| 5,638,534 A | 6/1997 | Mote, Jr. | 395/485 |
| 5,659,798 A | 8/1997 | Blumrich et al. | 395/846 |
| 5,687,325 A | 11/1997 | Chang | 395/284 |
| 5,706,224 A | 1/1998 | Srinivasan et al. | 365/49 |
| 5,710,733 A | 1/1998 | Chengson et al. | 365/52 |
| 5,715,456 A | 2/1998 | Bennett et al. | 395/652 |
| 5,729,709 A | 3/1998 | Harness | 395/405 |
| 5,748,616 A | 5/1998 | Riley | 370/242 |
| 5,787,475 A | 7/1998 | Pawlowski | 711/137 |
| 5,796,413 A | 8/1998 | Shipp et al. | 345/522 |
| 5,818,844 A | 10/1998 | Singh et al. | 370/463 |
| 5,819,304 A | 10/1998 | Nilsen et al. | 711/5 |
| 5,822,255 A | 10/1998 | Uchida | 365/194 |
| 5,831,467 A | 11/1998 | Leung et al. | 327/319 |
| 5,832,250 A | 11/1998 | Whittaker | 395/471 |
| 5,875,352 A | 2/1999 | Gentry et al. | 395/843 |
| 5,875,454 A | 2/1999 | Craft et al. | 711/113 |
| 5,887,159 A | 3/1999 | Burrows | 395/567 |
| 5,928,343 A | 7/1999 | Farmwald et al. | 710/104 |
| 5,966,724 A | 10/1999 | Ryan | 711/105 |
| 5,973,935 A | 10/1999 | Schoenfeld et al. | 361/813 |
| 5,973,951 A | 10/1999 | Bechtolsheim et al. | 365/52 |
| 5,978,567 A | 11/1999 | Rebane et al. | 395/200.49 |
| 5,987,196 A | 11/1999 | Noble | 385/14 |
| 6,023,726 A | 2/2000 | Saksena | 709/219 |
| 6,026,226 A | 2/2000 | Heile et al. | 395/500.13 |
| 6,029,250 A | 2/2000 | Keeth | 713/400 |
| 6,031,241 A | 2/2000 | Silfvast et al. | 250/504 R |
| 6,033,951 A | 3/2000 | Chao | 438/253 |
| 6,038,630 A | 3/2000 | Foster et al. | 710/132 |
| 6,061,263 A | 5/2000 | Boaz et al. | 365/51 |
| 6,061,296 A | 5/2000 | Ternullo, Jr. et al. | 365/233 |
| 6,067,262 A | 5/2000 | Irrinki et al. | 365/201 |
| 6,067,649 A | 5/2000 | Goodwin | 714/718 |
| 6,073,190 A | 6/2000 | Rooney | 710/56 |
| 6,076,139 A | 6/2000 | Welker et al. | 711/104 |
| 6,078,451 A | 6/2000 | Ioki | 360/51 |
| 6,079,008 A | 6/2000 | Clery, III | 712/11 |
| 6,092,158 A | 7/2000 | Harriman et al. | 711/151 |
| 6,098,158 A | 8/2000 | Lay et al. | 711/162 |
| 6,101,151 A | 8/2000 | Watanabe et al. | 365/233 |
| 6,105,075 A | 8/2000 | Ghaffari | 710/5 |
| 6,111,757 A | 8/2000 | Dell et al. | 361/737 |
| 6,125,431 A | 9/2000 | Kobayashi | 711/154 |
| 6,128,703 A | 10/2000 | Bourekas et al. | 711/138 |
| 6,131,149 A | 10/2000 | Lu et al. | 711/167 |
| 6,134,624 A | 10/2000 | Burns et al. | 710/131 |
| 6,137,709 A | 10/2000 | Boaz et al. | 365/51 |
| 6,144,587 A | 11/2000 | Yoshida | 365/189.05 |
| 6,167,465 A | 12/2000 | Parvin et al. | 710/22 |
| 6,167,486 A | 12/2000 | Lee et al. | 711/120 |
| 6,175,571 B1 | 1/2001 | Haddock et al. | 370/423 |
| 6,185,352 B1 | 2/2001 | Hurley | 385/114 |
| 6,185,676 B1 | 2/2001 | Poplingher et al. | 712/239 |
| 6,186,400 B1 | 2/2001 | Dvorkis et al. | 235/462.45 |
| 6,191,663 B1 | 2/2001 | Hannah | 333/17.3 |
| 6,201,724 B1 | 3/2001 | Ishizaki et al. | 365/49 |
| 6,208,180 B1 | 3/2001 | Fisch et al. | 327/141 |
| 6,219,725 B1 | 4/2001 | Diehl et al. | 710/26 |
| 6,223,301 B1 | 4/2001 | Santeler et al. | 714/6 |
| 6,226,729 B1 | 5/2001 | Stevens et al. | 711/171 |
| 6,229,727 B1 | 5/2001 | Doyle | 365/63 |
| 6,233,376 B1 | 5/2001 | Updegrove | 385/14 |
| 6,243,769 B1 | 6/2001 | Rooney | 710/56 |
| 6,243,831 B1 | 6/2001 | Mustafa et al. | 714/24 |
| 6,246,618 B1 | 6/2001 | Yamamoto et al. | 365/200 |
| 6,247,107 B1 | 6/2001 | Christie | 711/216 |
| 6,249,802 B1 | 6/2001 | Richardson et al. | 709/200 |
| 6,256,692 B1 | 7/2001 | Yoda et al. | 710/104 |
| 6,266,730 B1 | 7/2001 | Perino et al. | 710/126 |
| 6,272,609 B1 | 8/2001 | Jeddeloh | 711/169 |
| 6,285,349 B1 | 9/2001 | Smith | 345/147 |
| 6,286,083 B1 | 9/2001 | Chin et al. | 711/151 |
| 6,294,937 B1 | 9/2001 | Crafts et al. | 327/158 |
| 6,301,637 B1 | 10/2001 | Krull et al. | 711/112 |
| 6,327,642 B1 | 12/2001 | Lee et al. | 711/120 |
| 6,330,205 B2 | 12/2001 | Shimizu et al. | 365/230.06 |
| 6,347,055 B1 | 2/2002 | Motomura | 365/189.05 |
| 6,349,363 B2 | 2/2002 | Cai et al. | 711/129 |
| 6,356,573 B1 | 3/2002 | Jonsson et al. | 372/46 |
| 6,367,074 B1 | 4/2002 | Bates et al. | 717/11 |
| 6,370,068 B2 | 4/2002 | Rhee | 365/196 |
| 6,370,611 B1 | 4/2002 | Callison et al. | 711/105 |
| 6,373,777 B1 | 4/2002 | Suzuki | 365/230.03 |
| 6,381,190 B1 | 4/2002 | Shinkai | 365/230.03 |
| 6,389,514 B1 | 5/2002 | Rokicki | 711/136 |
| 6,392,653 B1 | 5/2002 | Malandain et al. | 345/501 |
| 6,401,213 B1 | 6/2002 | Jeddeloh | 713/401 |
| 6,405,280 B1 | 6/2002 | Ryan | 711/105 |
| 6,421,744 B1 | 7/2002 | Morrison et al. | 710/22 |
| 6,430,696 B1 | 8/2002 | Keeth | 713/503 |
| 6,433,785 B1 | 8/2002 | Garcia et al. | 345/531 |
| 6,434,639 B1 | 8/2002 | Haghighi | 710/39 |
| 6,434,654 B1 | 8/2002 | Story et al. | 710/307 |
| 6,434,696 B1 | 8/2002 | Kang | 713/2 |
| 6,434,736 B1 | 8/2002 | Schaecher et al. | 716/17 |
| 6,438,622 B1 | 8/2002 | Haghighi et al. | 710/1 |
| 6,438,668 B1 | 8/2002 | Esfahani et al. | 711/165 |
| 6,449,308 B1 | 9/2002 | Knight, Jr. et al. | 375/212 |
| 6,453,377 B1 | 9/2002 | Farnworth et al. | 710/300 |
| 6,453,393 B1 | 9/2002 | Holman et al. | 711/154 |
| 6,457,116 B1 * | 9/2002 | Mirsky et al. | 326/38 |
| 6,460,114 B1 | 10/2002 | Jeddeloh | 711/120 |
| 6,462,978 B2 | 10/2002 | Shibata et al. | 365/63 |
| 6,463,059 B1 | 10/2002 | Movshovich et al. | 370/389 |

| | | | |
|---|---|---|---|
| 6,470,422 B2 | 10/2002 | Cai et al. | 711/129 |
| 6,473,828 B1 | 10/2002 | Matsui | 711/104 |
| 6,477,592 B1 | 11/2002 | Chen et al. | 710/52 |
| 6,477,614 B1 | 11/2002 | Leddige et al. | 711/5 |
| 6,477,621 B1 | 11/2002 | Lee et al. | 711/120 |
| 6,479,322 B2 | 11/2002 | Kawata et al. | 438/109 |
| 6,487,556 B1 | 11/2002 | Downs et al. | 707/101 |
| 6,490,188 B2 | 12/2002 | Nuxoll et al. | 365/63 |
| 6,493,803 B1 | 12/2002 | Pham et al. | 711/147 |
| 6,496,193 B1 | 12/2002 | Surti et al. | 345/552 |
| 6,496,909 B1 | 12/2002 | Schimmel | 711/163 |
| 6,501,471 B1 | 12/2002 | Venkataraman et al. | 345/424 |
| 6,502,161 B1 | 12/2002 | Perego et al. | 711/5 |
| 6,505,287 B2 | 1/2003 | Uematsu | 711/170 |
| 6,523,092 B1 | 2/2003 | Fanning | 711/134 |
| 6,523,093 B1 | 2/2003 | Bogin et al. | 711/137 |
| 6,526,483 B1 | 2/2003 | Cho et al. | 711/154 |
| 6,526,498 B1 * | 2/2003 | Mirsky et al. | 712/11 |
| 6,539,490 B1 | 3/2003 | Forbes et al. | 713/401 |
| 6,552,564 B1 | 4/2003 | Forbes et al. | 326/30 |
| 6,553,479 B2 * | 4/2003 | Mirsky et al. | 326/38 |
| 6,564,329 B1 | 5/2003 | Cheung et al. | 713/322 |
| 6,570,429 B1 | 5/2003 | Hellriegel | 327/295 |
| 6,584,543 B2 | 6/2003 | Williams et al. | 711/105 |
| 6,587,912 B2 | 7/2003 | Leddige et al. | 711/5 |
| 6,590,816 B2 | 7/2003 | Perner | 365/200 |
| 6,594,713 B1 | 7/2003 | Fuoco et al. | 710/31 |
| 6,594,722 B1 | 7/2003 | Willke, II et al. | 710/313 |
| 6,598,154 B1 | 7/2003 | Vaid et al. | 712/237 |
| 6,615,325 B2 | 9/2003 | Mailloux et al. | 711/154 |
| 6,622,227 B2 | 9/2003 | Zumkehr et al. | 711/167 |
| 6,628,294 B1 | 9/2003 | Sadowsky et al. | 345/568 |
| 6,629,220 B1 | 9/2003 | Dyer | 711/158 |
| 6,631,440 B2 | 10/2003 | Jenne et al. | 711/105 |
| 6,636,110 B1 | 10/2003 | Ooishi et al. | 327/565 |
| 6,636,957 B2 | 10/2003 | Stevens et al. | 711/171 |
| 6,643,787 B1 | 11/2003 | Zerbe et al. | 713/400 |
| 6,646,929 B1 | 11/2003 | Moss et al. | 365/194 |
| 6,647,470 B1 | 11/2003 | Janzen | 711/154 |
| 6,651,139 B1 | 11/2003 | Ozeki et al. | 711/118 |
| 6,658,509 B1 | 12/2003 | Bonella et al. | 710/100 |
| 6,662,304 B2 | 12/2003 | Keeth et al. | 713/400 |
| 6,665,202 B2 | 12/2003 | Lindahl et al. | 365/49 |
| 6,667,895 B2 | 12/2003 | Jang et al. | 365/63 |
| 6,681,292 B2 | 1/2004 | Creta et al. | 711/119 |
| 6,697,926 B2 | 2/2004 | Johnson et al. | 711/167 |
| 6,715,018 B2 | 3/2004 | Farnworth et al. | 710/300 |
| 6,718,440 B2 | 4/2004 | Maiyuran et al. | 711/137 |
| 6,721,187 B2 | 4/2004 | Hall et al. | 361/760 |
| 6,721,195 B2 | 4/2004 | Brunelle et al. | 365/63 |
| 6,724,685 B2 | 4/2004 | Braun et al. | 365/233 |
| 6,728,800 B1 | 4/2004 | Lee et al. | 710/54 |
| 6,735,679 B1 | 5/2004 | Herbst et al. | 711/167 |
| 6,735,682 B2 | 5/2004 | Segelken et al. | 711/220 |
| 6,745,275 B2 | 6/2004 | Chang | 710/305 |
| 6,751,113 B2 | 6/2004 | Bhakta et al. | 365/63 |
| 6,751,703 B2 | 6/2004 | Chilton | 711/113 |
| 6,751,722 B2 * | 6/2004 | Mirsky et al. | 712/15 |
| 6,754,117 B2 | 6/2004 | Jeddeloh | 365/201 |
| 6,754,812 B1 | 6/2004 | Abdallah et al. | 712/234 |
| 6,756,661 B2 | 6/2004 | Tsuneda et al. | 257/673 |
| 6,760,833 B1 | 7/2004 | Dowling | 712/34 |
| 6,771,538 B2 | 8/2004 | Shukuri et al. | 365/185.05 |
| 6,772,261 B1 | 8/2004 | D'Antonio et al. | 710/301 |
| 6,775,747 B2 | 8/2004 | Venkatraman | 711/137 |
| 6,785,780 B1 | 8/2004 | Klein et al. | 711/148 |
| 6,789,173 B1 | 9/2004 | Tanaka et al. | 711/147 |
| 6,792,059 B2 | 9/2004 | Yuan et al. | 375/354 |
| 6,792,496 B2 | 9/2004 | Aboulenein et al. | 710/306 |
| 6,793,408 B2 | 9/2004 | Levy et al. | 385/88 |
| 6,795,899 B2 | 9/2004 | Dodd et al. | 711/137 |
| 6,799,246 B1 | 9/2004 | Wise et al. | 711/117 |
| 6,799,268 B1 | 9/2004 | Boggs et al. | 712/228 |
| 6,804,760 B2 | 10/2004 | Wiliams | 711/170 |
| 6,804,764 B2 | 10/2004 | LaBerge et al. | 711/170 |
| 6,807,630 B2 | 10/2004 | Lay et al. | 713/2 |
| 6,811,320 B1 | 11/2004 | Abbott | 385/58 |
| 6,816,931 B2 | 11/2004 | Shih | 710/62 |
| 6,816,947 B1 | 11/2004 | Huffman | 711/151 |
| 6,820,181 B2 | 11/2004 | Jeddeloh et al. | 711/169 |
| 6,821,029 B1 | 11/2004 | Grung et al. | 385/92 |
| 6,823,023 B1 | 11/2004 | Hannah | 375/296 |
| 6,845,409 B1 | 1/2005 | Talagala et al. | 710/20 |
| 6,889,304 B2 | 5/2005 | Perego et al. | 711/170 |
| 6,910,109 B2 | 6/2005 | Holman et al. | 711/156 |
| 6,950,956 B2 | 9/2005 | Zerbe et al. | 713/400 |
| 6,956,996 B2 | 10/2005 | Gordon et al. | 385/48 |
| 6,961,259 B2 | 11/2005 | Lee et al. | 365/63 |
| 6,982,892 B2 | 1/2006 | Lee et al. | 365/63 |
| 7,000,062 B2 | 2/2006 | Perego et al. | 711/5 |
| 7,016,213 B2 | 3/2006 | Reeves et al. | 365/63 |
| 7,016,606 B2 | 3/2006 | Cai et al. | 398/27 |
| 7,024,547 B2 | 4/2006 | Kartoz | 713/1 |
| 7,035,212 B1 | 4/2006 | Mittal et al. | 370/230 |
| 7,047,351 B2 | 5/2006 | Jeddeloh | 711/114 |
| 7,062,595 B2 | 6/2006 | Lindsay et al. | 710/315 |
| 2001/0023474 A1 | 9/2001 | Kyozuka et al. | 711/114 |
| 2001/0034839 A1 | 10/2001 | Karjoth et al. | 713/190 |
| 2001/0039612 A1 | 11/2001 | Lee | 713/2 |
| 2002/0038412 A1 | 3/2002 | Nizar et al. | 711/170 |
| 2002/0112119 A1 | 8/2002 | Halbert et al. | 711/115 |
| 2002/0144064 A1 | 10/2002 | Fanning | 711/144 |
| 2003/0005223 A1 | 1/2003 | Coulson et al. | 711/118 |
| 2003/0043158 A1 | 3/2003 | Wasserman et al. | 345/545 |
| 2003/0043426 A1 | 3/2003 | Baker et al. | 359/109 |
| 2003/0093630 A1 | 5/2003 | Richard et al. | 711/154 |
| 2003/0149809 A1 | 8/2003 | Jensen et al. | 710/22 |
| 2003/0163649 A1 | 8/2003 | Kapur et al. | 711/146 |
| 2003/0177320 A1 | 9/2003 | Sah et al. | 711/158 |
| 2003/0193927 A1 | 10/2003 | Hronik | 370/351 |
| 2003/0217223 A1 | 11/2003 | Nino, Jr. et al. | 711/105 |
| 2003/0227798 A1 | 12/2003 | Pax | 365/189.12 |
| 2003/0229734 A1 | 12/2003 | Chang et al. | 710/36 |
| 2003/0229770 A1 | 12/2003 | Jeddeloh | 711/213 |
| 2004/0022094 A1 | 2/2004 | Radhakrishnan et al. | 365/200 |
| 2004/0044833 A1 | 3/2004 | Ryan | 711/5 |
| 2004/0064602 A1 | 4/2004 | George | 710/22 |
| 2004/0123088 A1 | 6/2004 | Poisner et al. | 713/1 |
| 2004/0126115 A1 | 7/2004 | Levy et al. | 398/116 |
| 2004/0128421 A1 | 7/2004 | Forbes | 710/303 |
| 2004/0144994 A1 | 7/2004 | Lee et al. | 257/200 |
| 2004/0148482 A1 | 7/2004 | Grundy et al. | 711/167 |
| 2004/0230718 A1 | 11/2004 | Polzin et al. | 710/22 |
| 2004/0236885 A1 | 11/2004 | Fredriksson et al. | 710/100 |
| 2005/0044327 A1 | 2/2005 | Howard et al. | 711/147 |
| 2005/0071542 A1 | 3/2005 | Weber et al. | 711/105 |
| 2005/0162882 A1 | 7/2005 | Reeves et al. | 365/63 |
| 2006/0023528 A1 | 2/2006 | Pax et al. | 365/202 |
| 2006/0179203 A1 | 8/2006 | Jeddeloh | 710/311 |
| 2006/0179208 A1 | 8/2006 | Jeddeloh | 711/100 |
| 2006/0195647 A1 | 8/2006 | Jeddeloh | 711/100 |
| 2006/0200598 A1 | 9/2006 | Janzen | 710/58 |

FOREIGN PATENT DOCUMENTS

| | | |
|---|---|---|
| JP | 2001265539 A | 9/2001 |
| WO | WO 93/19422 | 9/1993 |
| WO | WO 02/27499 A2 | 4/2002 |

OTHER PUBLICATIONS

"Free On-Line Dictionary of Computing" entry Flash Erasable Programmable Read-Only Memory, online May 17, 2004 [http://foldoc.doc.ic.ac.uk/foldoc/foldoc/cgi?flash+memory].

Intel, "Intel 840 Chipset: 82840 Memory Controller Hub (MCH)", Datasheet, Oct. 1999, pp. 1-178.

Micron Technology, Inc., "Synchronous DRAM Module 512MB/1GB (×72, ECC) 168-PIN Registered FBGA SDRAM DIMM", Micron Technology, Inc., 2002, pp. 1-23, no month.

Gillett, R. et al., "*Using The Memory Channel Network*", Micro IEEE, vol. 17, Issue 1, Jan.-Feb. 1997 (Abstract Only).

Gommans et al., "*Applications Drive Secure Lightpath Creation Across Heterogeneous Domains*", Communications Magazine, IEEE, vol. 44, Issue 3, Mar. 2006 (Abstract Only).

Hsieh et al., "*On The Design Of A Local Switch For Heterogenous Milti-subsystem Interconnected*", IEEE Xplore, Oct. 1993 (Abstract Only).

Depari, A. et al., "*USB Sensor Network For Industrial Aplications*", IEEE Xplore, May 2004 (Abstract Only).

\* cited by examiner

MEMORY MODULE AND METHOD HAVING IMPROVED SIGNAL ROUTING TOPOLOGY

CROSS-REFERENCE TO RELATED APPLICATION

This application is a continuation of pending U.S. patent application Ser. No. 10/460,588, filed Jun. 11, 2003.

TECHNICAL FIELD

The present invention relates to memory systems, and, more particularly, to memory modules having transmission lines coupled to a large number of memory devices.

BACKGROUND OF THE INVENTION

Memory devices are in widespread use in a variety of processor-based systems, such as computer systems. In some cases, memory devices can be mounted on the same circuit board as a processor and a memory controller, which is generally used to couple the memory devices to the processor. However, in most cases, the memory devices are part of a memory module in which several memory devices are mounted on a common substrate, such as a printed circuit board. The memory modules are generally plugged into sockets mounted on a motherboard to establish communication with a memory controller and processor. Such memory modules are commonly used in computer systems as system memory in which the memory modules are dynamic random access memory ("DRAMs") devices.

Although the memory devices in a memory module may be coupled directly to a memory controller, in one type of memory module, known as a "registered" memory module, the memory devices are coupled to a register that is, in turn, coupled to the memory controller. More specifically, in a registered DRAM module, the command and address lines from the memory controller are coupled to a register. The register stores memory commands and addresses coupled through the command and address lines, respectively, and then couples the commands and addresses to the memory devices. Data signals are typically coupled directly to and from the memory devices without being registered. By registering the command and address signals, they can be coupled to the memory module for a relatively short period of time since it is not necessary to wait for the memory devices to latch the command and address signals. Also, registering the command and address signals avoids excessive loading of the command and address lines because the command and address lines are coupled to only a single device, i.e., the register, rather than to multiple devices, i.e., all of the memory devices.

The manner in which each of the command and address lines are routed from the register to the memory devices can significantly affect the performance of the memory module. One coupling topology, known as a "daisy chain" topology, is shown in FIG. 1A. In a daisy chain topology, a first transmission line 10, which may be a command signal line or an address signal line, extends from a register 16 to one end of a second transmission line 20 (which is a single conductor, but functions as separate segments or transmission lines 20a–g). Respective transmission lines 30a–h are coupled to spaced apart locations of the transmission lines 20(a–g). The transmission lines 30a–h each extend to an input terminal of respective memory devices 36a–h, which, in this case are DRAM devices.

A "hybrid tree" topology shown in FIG. 1B differs from the daisy chain topology of FIG. 1A in that the first transmission line 10 is coupled to the center of the second transmission line 20a rather than to one of its ends. In alternative embodiments of a hybrid tree topology, the first transmission line 10 may be coupled to locations of the second transmission lines 20(a–d) other than either one end or the center of the second transmission line 20. Like the daisy chain topology shown in FIG. 1A, respective transmission lines 30a–h are coupled to spaced apart locations of the transmission lines 20a–d and extend to input terminals of the respective memory devices 36a–h.

Still another hybrid tree topology shown in FIG. 1C uses two separate transmission lines 20a,b coupled to the transmission lines 30a–d, 30e–h. Transmission lines 20a and 20b are made up of transmission lines 20aa, 20ab, 20ac, 20ad, 20ba, 20bb, 20bc and 20bd respectively. The transmission lines 20a,b are, in turn, coupled to the first transmission line 10 through a third transmission line 40, which joins the first transmission line 10 at the center of the transmission line 40. Transmission line 40 is made up of transmission lines 44a and 44b. Transmission lines 44a and 44b are coupled to the transmission lines 20a,b at the ends of the transmission line 40 by respective transmission lines 44a,b.

The daisy chain and hybrid tree topologies shown in FIGS. 1A–1C can provide adequate performance at relatively slow speeds, but they provide less than optimum performance at higher operating speeds. In particular, signals coupled through the transmission line 20 (or transmission lines 20a,b in the case of the topology shown in FIG. 1C) reflect from the junctions with the transmission lines 30a–h as well as from the junction between each of the transmission lines 30a–h and its respective memory devices 36a–h, respectively. These reflections produce destructive and constructive interference at each of the junctions between the transmission line 20 and the transmission lines 30a–h that can seriously degrade signals coupled to the memory devices 36. The hybrid tree topologies shown in FIGS. 1B and 1C place the transmission lines 30a–h closer to the ends of the transmission line 20 compared to the daisy chain topology shown in FIG. 1A. Therefore, the hybrid tree topologies tend to provide better performance than the daisy chain topology. However, the hybrid tree topologies still provide less than optimum performance. Further, the hybrid tree topology shown in FIG. 1C also produces reflections from the junctions between the transmission lines 20a,b and the transmission lines 44a,b.

Although the signal reflection problems have been described in the context of registered memory modules, the same problem can exist in other types of memory modules. For example, in a memory hub module, signals are coupled from a memory hub in the module to each of several memory devices in the module. Also, in a buffered memory module, signals are coupled from respective buffers in the module to each of several memory devices in the module. Reflections produced in these types of memory modules can degrade performance in essentially the same manner as described above.

There is therefore a need for a connection topology for routing signals to memory devices in memory modules that can avoid signal degradation caused by reflections generated at the junctions between transmission lines and memory device terminals and between different transmission lines.

BRIEF SUMMARY OF THE INVENTION

A signal routing topology and method couples signals between an active memory component, such as a register, and a plurality of memory devices using transmission lines. The transmission lines are each connected at only its ends to either an input terminal of one of the memory devices or to an end of another of the transmission lines. The transmission lines form a symmetrical tree having several levels of hierarchy, with the transmission lines in the same level of hierarchy having the same length. The transmission lines are preferably impedance matched to pairs of transmission lines to which they are coupled. In the event the memory module contains an odd-numbered memory device, such as an error checking memory device, the odd-numbered memory device is coupled to the active memory component through a dedicated transmission line.

DETAILED DESCRIPTION

Figure 1A:
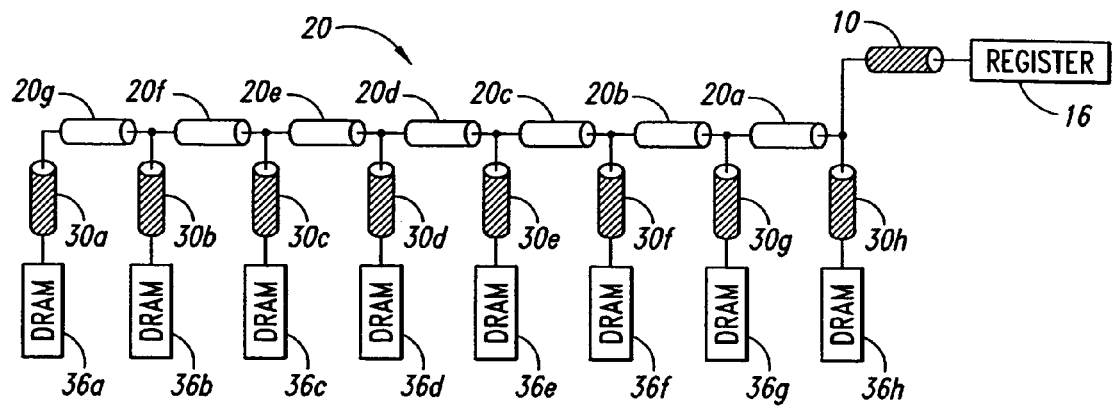
FIGS. 1A–1C are schematic diagrams showing topologies for routing signal lines from registers to memory devices in conventional registered memory modules.
Figure 1B:
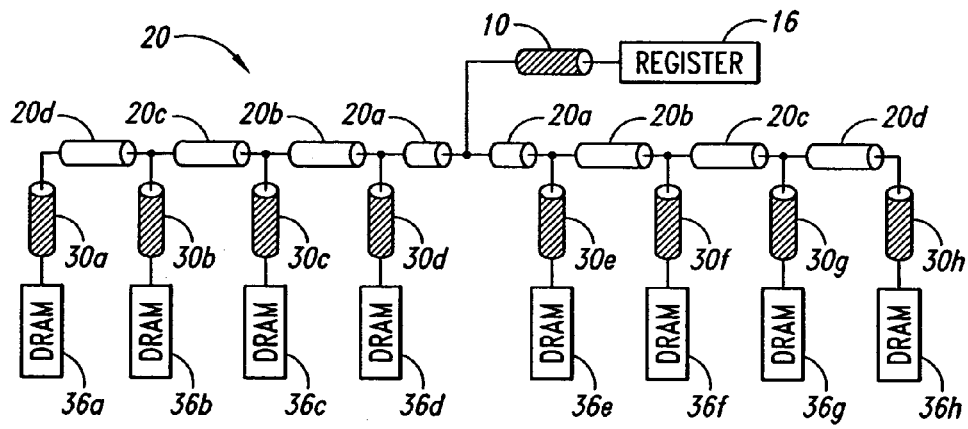
Figure 1C:
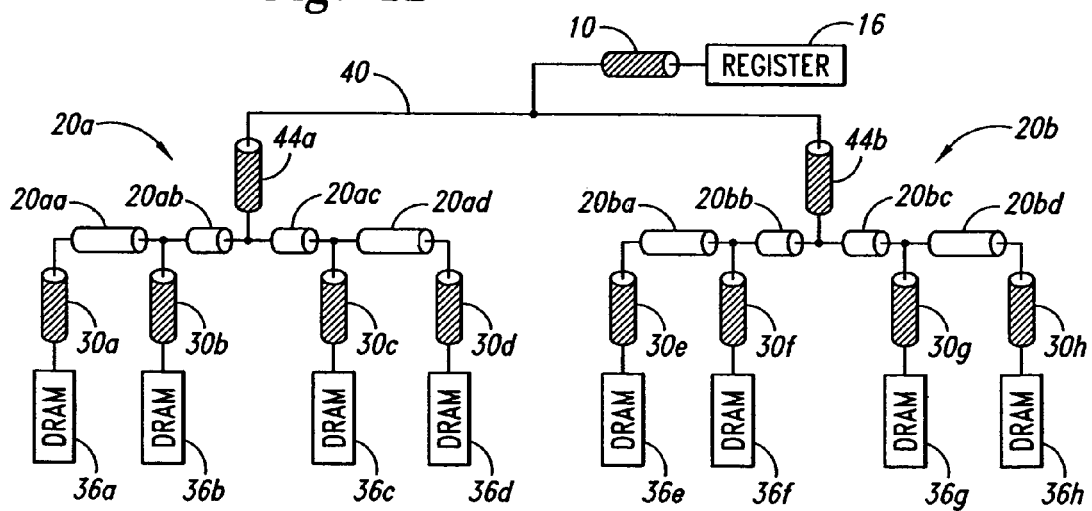
Figure 2:
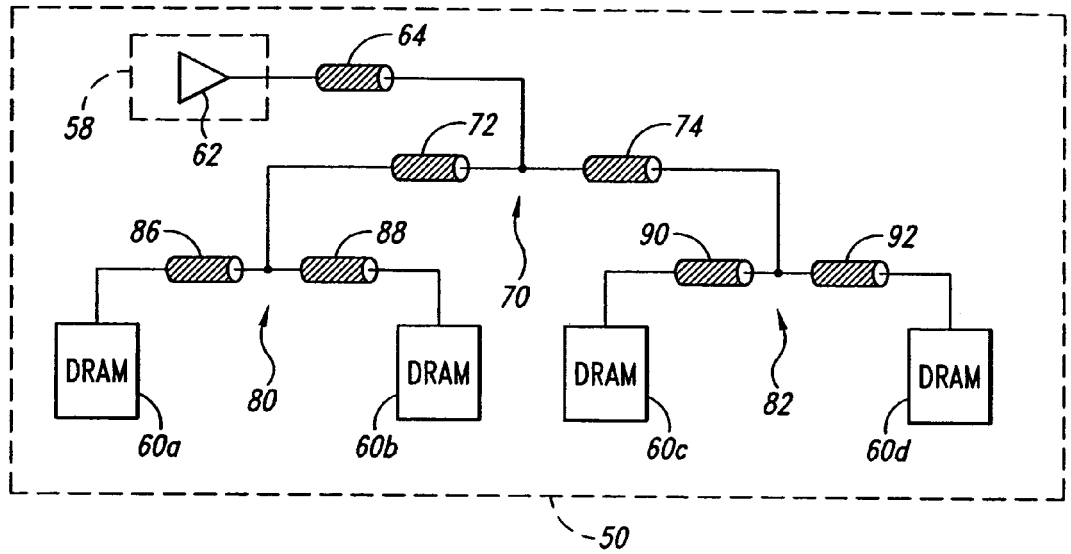
FIG. 2 is a schematic diagram showing one topology for routing transmission lines from a register to memory devices in a registered memory module according to one embodiment of the invention.

A topology for routing signals from a register to memory devices in a registered memory module according to one embodiment of the invention is shown in FIG. 2. The memory module 50 includes a register 58 and four dynamic random access memory ("DRAM") devices 60a–d. A large number of address and command lines are coupled from the register 58 to the DRAM devices 60a–d, although the signal lines for routing only one of these signals are shown in FIG. 2. The register 58 includes an output buffer 62 for each signal that is coupled to a first transmission line 64. The end of the first transmission line 64 is coupled to a first branch 70 that consists of two transmission lines 72, 74. The branch 70 is symmetrical in that both of the transmission lines 72, 74 have the same electrical and physical characteristics, particularly the same length. The ends of the transmission lines 72, 74 are coupled to a second pair of branches 80, 82, respectively. The branches 80, 82 are symmetrical internally and with each other as they are each formed by two transmission lines 86, 88 and 90, 92, respectively, having the same length. Although it is necessary that the transmission lines 86, 88 and 90, 92 of the respective branches 80, 82 all be of the same length, it is not necessary that the lengths of these transmission lines 86, 88, 90, 92 be equal to the lengths of the transmission lines 72, 74 in the branch 70. Finally, the end of each of the transmission lines 86, 88, 90, 92 is coupled to a respective one of the DRAMs 60a–d.

In operation, a signal is coupled through the first transmission line 64 to the transmission lines 72, 74 of the first branch 70. If these transmission lines are of the same impedance there is a mismatch and some of the energy reflected and some of the energy is passed. When the signal reaches the ends of the transmission lines 72, 74, it is again reflected from the junctions with the branches 80, 82, respectively. As a result, the signal is coupled to the branches 80, 82 with less magnitude. The reflections of the signal are then coupled back through the transmission lines 72, 74 to the junction of the transmission line 64. The reflected signals reach the junction with the transmission line 64 at the same time so that they appear as a single transmission line coupling to a higher impedance transmission line. This acts to reflect in phase increasing the voltage that eventually reaches the DRAMs. In a similar manner, the signal coupled to the branches 80, 82 have a relatively large magnitude at the ends of the transmission lines 86, 88 and 90, 92 because of their reflection from an input terminal of the DRAMs 60a–d. An open circuit reflects the signal resulting in an apparent doubling of the voltage. The signals reflected from the DRAMs 60a–d reach the junctions to the transmission lines 72, 74 at the same time because the lengths of the transmission lines 86, 88, 90, 92 are all identical. As a result, the impedance of the transmission lines 86, 88 and 90, 92 at their junction to the transmission lines 72, 74, respectively, appear to have a lower impedance coupling to a higher impedance resulting in an in phase reflection back to the DRAMs resulting in more signal at the DRAMs. The signals reflected through the transmission lines 86, 88 and 90, 92 are also coupled through the transmission lines 72, 74, respectively, of the first branch 70 where they reach the junction to the first transmission line 64 at the same time. Again another reflection back towards the DRAMs. The result of all these reflections is a stairstep of increasing voltage at the DRAMs.

Using a tree of transmission lines in which each branch is entirely symmetrical maximizes the magnitude of signals coupled to the DRAMs 60a–d and minimizes the magnitude of reflections reflected from the end of each transmission line. By coupling the DRAMs 60a–d only to the ends of the transmission lines, the destructive interference away from the ends of the transmission lines, which reduces signal amplitude, is avoided.

The symmetrical tree used in the memory module 50 of FIG. 2 includes branches with only two levels of hierarchy, namely the first branch 70 with a first level of hierarchy and the second branches 80, 82 with a second level of hierarchy. However, since each branch consists of two transmission lines each coupled to either a transmission line or a memory device at only its end, a memory module having $2^N$ of the memory devices will have N hierarchies of branches.

The reflections from the junctions between the transmission lines 86, 88 and 90, 92 and the transmission lines 72, 74, respectively, and from the junctions between the transmission lines 72, 74 and the transmission line 64 can be reduced even further by impedance matching the transmission lines. More specifically, as is well known in the art, each transmission line has a characteristic impedance. As is also well-known in the art, signals coupled through a transmission line are reflected from impedance discontinuities in the line. Therefore, such reflections can be avoided by avoiding impedance discontinuities. If the first transmission line 64 has an impedance of R (e.g., 17.5 ohms), the transmission lines 72, 74 in the first branch should each have an impedance of 2R (i.e., 35 ohms) since two resistors in parallel have an impedance of half the impedance of each resistor. Similarly, the transmission lines 86, 88, 90, 92 should each have an impedance of 4R (i.e., 70 ohms).

Although impedance matching of the transmission lines used in a symmetrical tree in accordance with the invention is desirable, it is not necessary. Furthermore, it may not be practical to provide impedance matching where the tree includes a large number of branch hierarchies because the practical range of impedance values that can be obtained is very limited. With commonly used conductive materials mounted on commonly used substrates, the transmission lines formed by the conductive materials become excessively wide at impedance values much less than 15 ohms, and they become excessively narrow at impedance values much larger than 80 ohms.

Figure 3:
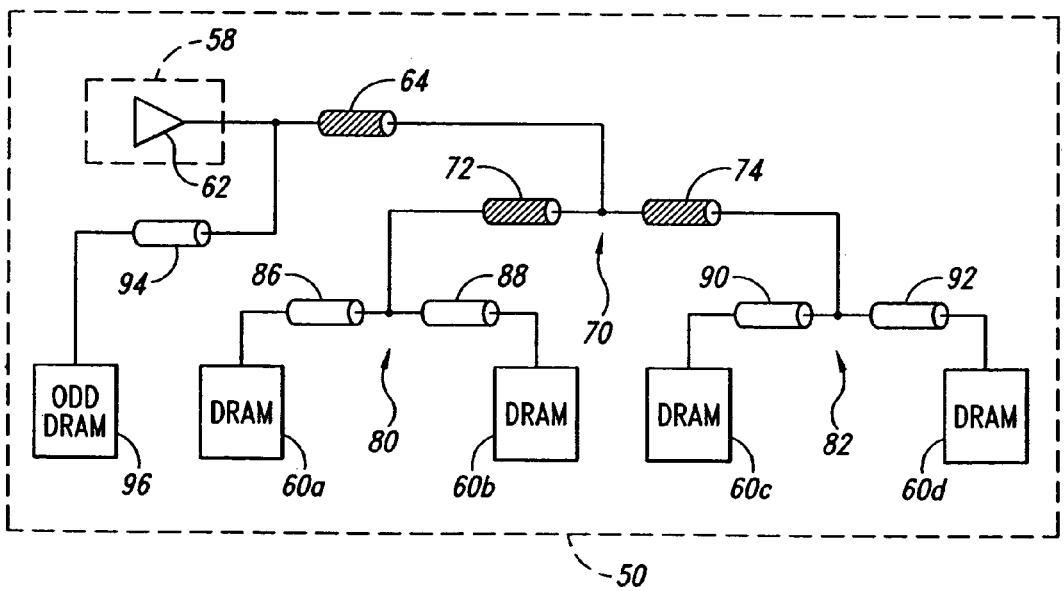
FIG. 3 is a schematic diagram showing a topology for routing transmission lines from a register to memory devices in a registered memory module having error checking capabilities according to another embodiment of the invention.

Data are commonly stored in a memory module using an even number of memory devices, and, more commonly, a number of memory devices equal to powers of two, i.e. 2, 4, 8, etc. However, some memory modules include error checking and/or correcting ("ECC") capabilities, which generally requires an additional memory device. The use of an odd number of memory devices, such as an ECC memory device, precludes coupling the memory devices through a symmetrical tree. However, the benefits of a symmetrical tree can be obtained using the topography shown in FIG. 3. FIG. 3 shows the same components of a memory module that are shown in FIG. 3 with the addition of an ECC DRAM 90. Therefore, in the interest of brevity, all of the component shown in FIG. 3 have been provided with the same reference numerals, and an explanation of their structure in operation will not be repeated. Although ECC capabilities can be obtained using the odd-numbered ECC DRAM 90 as shown in FIG. 3, ECC capabilities can also be obtained by simply using one of the DRAMs 60a–d to store ECC data.

The ECC DRAM 90 is coupled to the output of the buffer 62 through a dedicated transmission line 94 extending from a location at or near the buffer 62 to a terminal of the DRAM 90. By placing the junction between the transmission line 94 and the first transmission line 64 near the buffer 62, the magnitude of any reflections from the junction that are coupled through the tree is relatively small. The transmission line 94 preferably has a length that is equal to the combined length of the transmission lines between the buffer 62 and the DRAMs 60a–d so that a signal from the buffer 62 reaches the ECC DRAM 90 at the same time the signal reaches the DRAMs 60a–d. Also, any reflections from the DRAMs 60a–d reach the buffer 62 at the same time that any reflection from the ECC DRAM 90 reaches the buffer 62 so that the transmission lines to ECC DRAM 90 and DRAMs 60a–d can be considered to be in parallel. If the output impedance of buffer 62 is equal to this parallel impedance then signals reflected from the DRAMs 60a–d and 90 are not reflected from the output of the buffer 62.

Figure 4:
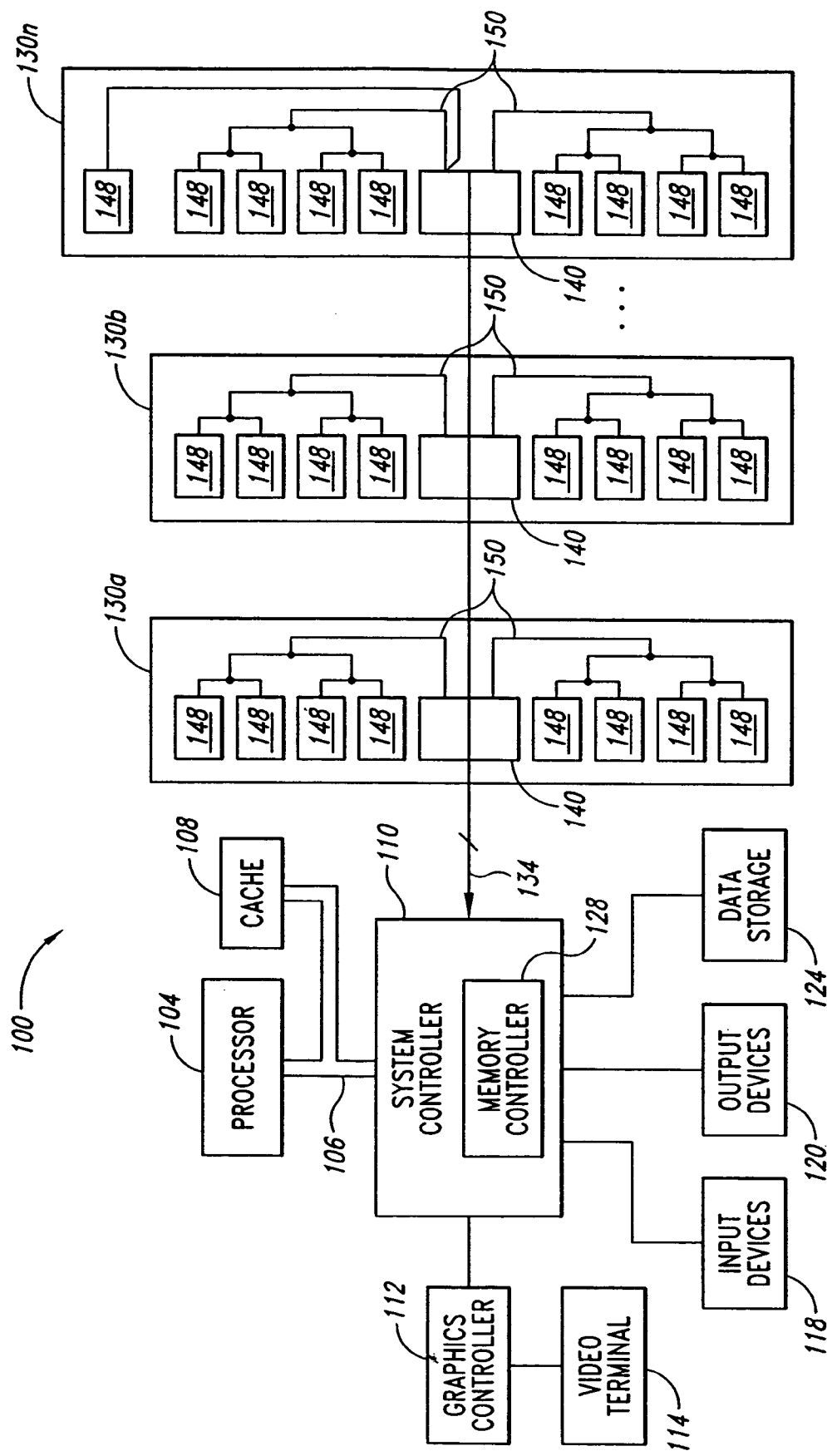
FIG. 4 is a block diagram of a computer system including registered memory modules in accordance with the present invention.

A computer system 100 according to one embodiment of the invention is shown in FIG. 4. The computer system 100 includes a processor 104 for performing various computing functions, such as executing specific software to perform specific calculations or tasks. The processor 104 includes a processor bus 106 that normally includes an address bus, a control bus, and a data bus. The processor bus 106 is typically coupled to cache memory 108, which, is typically static random access memory ("SRAM"). Finally, the processor bus 106 is coupled to a system controller 110, which is also sometimes referred to as a bus bridge.

The system controller 110 serves as a communications path to the processor 104 for a variety of other components. More specifically, the system controller 110 includes a graphics port that is typically coupled to a graphics controller 112, which is, in turn, coupled to a video terminal 114. The system controller 110 is also coupled to one or more input devices 118, such as a keyboard or a mouse, to allow an operator to interface with the computer system 100. Typically, the computer system 100 also includes one or more output devices 120, such as a printer, coupled to the processor 104 through the system controller 110. One or more data storage devices 124 are also typically coupled to the processor 104 through the system controller 110 to allow the processor 104 to store data or retrieve data from internal or external storage media (not shown). Examples of typical storage devices 124 include hard and floppy disks, tape cassettes, and compact disk read-only memories (CD-ROMs).

The system controller 110 includes a memory controller 128 that is coupled to several registered memory modules 130a,b . . . n, which serve as system memory for the computer system 100. The memory modules 130 are coupled to the memory controller 128 through a bus system 134. The memory modules 130 are shown coupled to the memory controller 128 in a multi-drop arrangement in which the single bus system 134 is coupled to all of the memory modules 130. However, it will be understood that other topologies may also be used.

Each of the memory modules 130 includes a register 140 for storing command and address signals as well as eight memory devices 148, which, in the example illustrated in FIG. 4, are synchronous dynamic random access memory ("SDRAM") devices. However, a fewer or greater number of memory devices 148 may be used, and memory devices other than SDRAM devices may also be used. The register 140 is coupled to each of the system memory devices 148 through symmetrical tree 150 in accordance with the present invention. An error checking and/or correcting memory device is included in the memory module 130n, in which the topography shown in FIG. 3 is preferably used.

From the foregoing it will be appreciated that, although specific embodiments of the invention have been described herein for purposes of illustration, various modifications may be made without deviating from the spirit and scope of the invention. For example, transmission line topologies according to the present invention can be used to couple signals to memory devices other than DRAMs and to memory devices from components other than registers. As previously mentioned, transmission line topologies according to the present invention can be used to route signals to memory devices from buffers or memory hubs, for example. Accordingly, the invention is not limited except as by the appended claims.

We claim:

1. A memory module, comprising:
   a plurality of dynamic random access memory devices;
   an active memory component having a plurality of terminals; and
   a respective conductor tree coupling each of the terminals of the active memory component to a terminal of each of the plurality of memory devices, each of the conductor trees comprising at least one branch, each branch including a pair of transmission lines each of which is connected at only its ends to either one of the memory devices, the respective terminal of the active memory component, or to an end of another of the transmission lines, the transmission lines being arranged in a plurality of hierarchies with the transmission lines in the same hierarchy have the same length.

2. The memory module of claim 1 wherein the active memory component comprises a register for storing address and command signals and outputting the stored address and command signals to the memory devices.

3. The memory module of claim 1 wherein each of the transmission lines in each branch has a characteristic impedance, and wherein the characteristic impedance of each transmission line is approximately half the characteristic impedance of any transmission line to which it is coupled downsteam of the active memory component.

4. The memory module of claim 1, further comprising:
an additional memory device other than the plurality of memory devices; and
a plurality of dedicated transmission lines each coupling a respective one of several of the terminals of the active memory component to respective terminals of the additional memory device.

5. The memory module of claim 4 wherein the additional memory device comprises an error checking memory device.

6. The memory module of claim 4 wherein the lengths of the dedicated transmission lines from the active memory component to the additional memory device are substantially equal to the lengths of the transmission lines in the tree from the active memory component to each of the plurality of memory devices.

7. The memory module of claim 1 wherein the transmission lines in all of the hierarchies have the same length.

8. The memory module of claim 1 wherein the memory module comprises $2^N$ of the memory devices, and wherein the tree comprise N hierarchies of branches.

9. The memory module of claim 1 wherein each of the transmission lines have a characteristic impedance, and wherein the transmission lines in the same hierarchy have the same characteristic impedance.

10. The memory module of claim 9 wherein each of the transmission lines in the same hierarchy have the same electrical characteristics.

11. The memory module of claim 1 wherein the terminals of the active memory component comprises output terminals, and the terminals of the memory devices comprise input terminals.

12. A memory module, comprising:
a plurality of memory devices;
an active memory component having a plurality of terminals, the active memory component comprising a register for storing address and command signals and outputting the stored address and command signals to the memory devices; and
a respective conductor tree coupling each of the terminals of the active memory component to a terminal of each of the plurality of memory devices, each of the conductor trees comprising at least one branch, each branch including a pair of transmission lines each of which is connected at only its ends to either one of the memory devices, the respective terminal of the active memory component, or to an end of another of the transmission lines, the transmission lines being arranged in a plurality of hierarchies with the transmission lines in the same hierarchy having electrical and physical characteristics that cause the signal propagation times through the transmission lines in the same hierarchy to be substantially equal to each other.

13. The memory module of claim 12 wherein each of the transmission lines in each branch has a characteristic impedance, and wherein the characteristic impedance of each transmission line is approximately half the characteristic impedance of any transmission line to which it is coupled downstream of the active memory component.

14. The memory module of claim 12 wherein the plurality of memory devices comprises a plurality of dynamic random access memory devices.

15. The memory module of claim 12, further comprising:
an additional memory device other than the plurality of memory devices; and
a plurality of dedicated transmission lines each coupling a respective one of several of the terminals of the active memory component to respective terminals of the additional memory device.

16. The memory module of claim 15 wherein the additional memory device comprises an error checking memory device.

17. The memory module of claim 15 wherein the signal propagation times through the dedicated transmission lines from the active memory component to the additional memory device are substantially equal to the signal propagation times through the transmission lines in the tree from the active memory component to each of the plurality of memory devices.

18. The memory module of claim 12 wherein the transmission lines in all of the hierarchies have the same signal propagation times.

19. The memory module of claim 12 wherein the memory module comprises $2^N$ of the memory devices, and wherein the tree comprise N hierarchies of branches.

20. The memory module of claim 12 wherein each of the transmission lines have a characteristic impedance, and wherein the transmission lines in the same hierarchy have the same characteristic impedance.

21. The memory module of claim 20 wherein each of the transmission lines in the same hierarchy have the same electrical characteristics.

22. The memory module of claim 12 wherein the transmission lines in the same hierarchy have the same lengths.

23. The memory module of claim 12 wherein the terminals of the active memory component comprises output terminals, and the terminals of the memory devices comprise input terminals.

24. A method of coupling signals between an active memory component in a memory module and a plurality of dynamic random access memory devices in the memory module, the method comprising coupling a plurality of the signals between the active memory component and the memory devices through a plurality of transmission lines in which each transmission line is connected at only its ends to either one of the memory devices or to an end of another of the transmission lines, the transmission lines being arranged in a plurality of hierarchies with the transmission lines in the same hierarchy having the same length.

25. The method of claim 24 wherein the active memory component comprises a register for storing address and command signals and outputting the stored address and command signals to the memory devices.

26. The method of claim 24 wherein each of the transmission lines has a characteristic impedance, and wherein the act of coupling a plurality of the signals between the active memory component and the memory devices through a plurality of transmission lines comprises coupling each of the signals between upstream transmission lines and downstream transmission lines in which the characteristic impedance of each downstream transmission line is twice the characteristic impedance of the upstream transmission line to which it is coupled.

27. The method of claim 24, further comprising coupling signals between the active memory component and an additional memory device mounted on the memory module substrate other than the plurality of memory devices, the method comprising coupling each of a plurality of the signals between the active memory component and the additional memory device through a respective dedicated transmission line that is not directly connected to any of the plurality of memory devices.

28. The method of claim 27 wherein the lengths of the dedicated transmission lines provide substantially the same propagation time as the length of the transmission lines between the active memory component and the plurality of memory devices.

29. The method of claim 24 wherein the plurality of memory devices comprise $2^N$ of the memory devices, and wherein the act of coupling a plurality of the signals between the active memory component and the memory devices through a plurality of transmission lines comprises arranging the transmission lines in N levels of hierarchy.

30. The method of claim 24 wherein the act of coupling a plurality of the signals between the active memory component and the memory devices through a plurality of transmission lines comprises coupling a plurality of the signals between from the memory devices to the active memory component through a plurality of transmission lines.

31. A method of coupling address and command signals between a register in a memory module for the storing address and command signals and a plurality of memory devices in the memory module, the method comprising coupling a plurality of the signals between the register and the memory devices through a plurality of transmission lines in which each transmission line is connected at only its ends to either one of the memory devices or to an end of another of the transmission lines, the transmission lines being arranged in a plurality of hierarchies with the transmission lines in the same hierarchy having electrical and physical characteristics that cause the signal propagation times through the transmission lines in the same hierarchy to be substantially equal to each other.

32. The method of claim 31 wherein each of the transmission lines has a characteristic impedance, and wherein the act of coupling a plurality of the signals between the active memory component and the memory devices through a plurality of transmission lines comprises coupling each of the signals between upstream transmission lines and downstream transmission lines in which the characteristic impedance of each downstream transmission line is twice the characteristic impedance of the upstream transmission line to which it is coupled.

33. The method of claim 31 wherein the plurality of memory devices comprises a plurality of dynamic random access memory devices.

34. The method of claim 31, further comprising coupling signals between the active memory component and an additional memory device mounted on the memory module substrate other than the plurality of memory devices, the method comprising coupling each of a plurality of the signals between the active memory component and the additional memory device through a respective dedicated transmission line that is not directly connected to any of the plurality of memory devices.

35. The method of claim 34 wherein the dedicated transmission lines have electrical and physical characteristics that cause the signal propagation times through the dedicated transmission lines between the active memory component and the additional memory device be substantially equal to the signal propagation times through the transmission lines between the active memory component and each of the plurality of memory devices.

36. The method of claim 31 wherein the plurality of memory devices comprise $2^N$ of the memory devices, and wherein the act of coupling a plurality of the signals between the active memory component and the memory devices through a plurality of transmission lines comprises arranging the transmission lines in N levels of hierarchy.

37. The method of claim 31 wherein the act of coupling a plurality of the signals between the active memory component and the memory devices through a plurality of transmission lines comprises coupling a plurality of the signals between from the memory devices to the active memory component through a plurality of transmission lines.

38. A memory module, comprising:
a plurality of memory devices;
an active memory component having a plurality of terminals; and
a respective conductor tree coupling each of the terminals of the active memory component to a terminal of each of the plurality of memory devices, each of the conductor trees comprising at least one branch, each branch including a pair of transmission lines each of which has a characteristic impedance and is connected at only its ends to either one of the memory devices, the respective terminal of the active memory component, or to an end of another of the transmission lines, the transmission lines being arranged in a plurality of hierarchies with the transmission lines in the same hierarchy having electrical and physical characteristics that cause the signal propagation times through the transmission lines in the same hierarchy to be substantially equal to each other, the characteristic impedance of each transmission line being approximately half the characteristic impedance of any transmission line to which it is coupled downsteam of the active memory component.

39. The memory module of claim 38 wherein the plurality of memory devices comprises a plurality of dynamic random access memory devices.

40. The memory module of claim 38, further comprising:
an additional memory device other than the plurality of memory devices; and
a plurality of dedicated transmission lines each coupling a respective one of several of the terminals of the active memory component to respective terminals of the additional memory device.

41. The memory module of claim 38 wherein the transmission lines in all of the hierarchies have the same signal propagation times.

42. The memory module of claim 38 wherein the memory module comprises $2^N$ of the memory devices, and wherein the tree comprise N hierarchies of branches.

43. The memory module of claim 38 wherein each of the transmission lines in the same hierarchy have the same electrical characteristics.

44. The memory module of claim 38 wherein the transmission lines in the same hierarchy have the same lengths.

45. The memory module of claim 38 wherein the terminals of the active memory component comprises output terminals, and the terminals of the memory devices comprise input terminals.

46. A memory module, comprising:
a plurality of dynamic random access memory devices;
an active memory component having a plurality of terminals; and
a respective conductor tree coupling each of the terminals of the active memory component to a terminal of each of the plurality of memory devices, each of the conductor trees comprising at least one branch, each branch including a pair of transmission lines each of which is connected at only its ends to either one of the memory devices, the respective terminal of the active memory component, or to an end of another of the transmission lines, the transmission lines being arranged in a plurality of hierarchies with the transmission lines in the same hierarchy having electrical and physical characteristics that cause the signal propagation times through the transmission lines in the same hierarchy to be substantially equal to each other.

47. The memory module of claim 46, further comprising:
an additional memory device other than the plurality of memory devices; and
a plurality of dedicated transmission lines each coupling a respective one of several of the terminals of the active memory component to respective terminals of the additional memory device.

48. The memory module of claim 46 wherein the transmission lines in all of the hierarchies have the same signal propagation times.

49. The memory module of claim 46 wherein the memory module comprises $2^N$ of the memory devices, and wherein the tree comprise N hierarchies of branches.

50. The memory module of claim 46 wherein each of the transmission lines in the same hierarchy have the same electrical characteristics.

51. The memory module of claim 46 wherein the transmission lines in the same hierarchy have the same lengths.

52. The memory module of claim 46 wherein the terminals of the active memory component comprises output terminals, and the terminals of the memory devices comprise input terminals.

53. A memory module, comprising:
a plurality of memory devices;
an active memory component having a plurality of terminals;
an additional memory device other than the plurality of memory devices;
a respective conductor tree coupling each of the terminals of the active memory component to a terminal of each of the plurality of memory devices, each of the conductor trees comprising at least one branch, each branch including a pair of transmission lines each of which is connected at only its ends to either one of the memory devices, the respective terminal of the active memory component, or to an end of another of the transmission lines, the transmission lines being arranged in a plurality of hierarchies with the transmission lines in the same hierarchy having electrical and physical characteristics that cause the signal propagation times through the transmission lines in the same hierarchy to be substantially equal to each other; and
a plurality of dedicated transmission lines each coupling a respective one of several of the terminals of the active memory component to respective terminals of the additional memory device.

54. The memory module of claim 53 wherein the additional memory device comprises an error checking memory device.

55. The memory module of claim 53 wherein the signal propagation times through the dedicated transmission lines from the active memory component to the additional memory device are substantially equal to the signal propagation times through the transmission lines in the tree from the active memory component to each of the plurality of memory devices.

56. The memory module of claim 53 wherein the transmission lines in all of the hierarchies have the same signal propagation times.

57. The memory module of claim 53 wherein each of the transmission lines in the same hierarchy have the same electrical characteristics.

58. The memory module of claim 53 wherein the transmission lines in the same hierarchy have the same lengths.

59. The memory module of claim 53 wherein the terminals of the active memory component comprises output terminals, and the terminals of the memory devices comprise input terminals.

60. A memory module, comprising:
a plurality of memory devices;
an active memory component having a plurality of terminals; and
a respective conductor tree coupling each of the terminals of the active memory component to a terminal of each of the plurality of memory devices, each of the conductor trees comprising at least one branch, each branch including a pair of transmission lines each of which is connected at only its ends to either one of the memory devices, the respective terminal of the active memory component, or to an end of another of the transmission lines, the transmission lines being arranged in a plurality of hierarchies with the transmission lines in the same hierarchy having the same electrical characteristics and electrical and physical characteristics that cause the signal propagation times through the transmission lines in the same hierarchy to be substantially equal to each other.

61. The memory module of claim 60 wherein the transmission lines in the same hierarchy have the same lengths.

62. The memory module of claim 60 wherein the terminals of the active memory component comprises output terminals, and the terminals of the memory devices comprise input terminals.

63. A memory module, comprising:
a plurality of memory devices;
an active memory component having a plurality of terminals; and
a respective conductor tree coupling each of the terminals of the active memory component to a terminal of each of the plurality of memory devices, each of the conductor trees comprising at least one branch, each branch including a pair of transmission lines each of which is connected at only its ends to either one of the memory devices, the respective terminal of the active memory component, or to an end of another of the transmission lines, the transmission lines being arranged in a plurality of hierarchies with the transmission lines in the same hierarchy having the same length and electrical and physical characteristics that cause the signal propagation times through the transmission lines in the same hierarchy to be substantially equal to each other.

64. The memory module of claim 63 wherein the terminals of the active memory component comprises output terminals, and the terminals of the memory devices comprise input terminals.

65. A memory module, comprising:
a plurality of memory devices each of which has a plurality of input terminals;
an active memory component having a plurality of output terminals; and
a respective conductor tree coupling each of the output terminals of the active memory component to one of the input terminal of each of the plurality of memory devices, each of the conductor trees comprising at least one branch, each branch including a pair of transmission lines each of which is connected at only its ends to either one of the memory devices, the respective output terminal of the active memory component, or to an end of another of the transmission lines, the transmission lines being arranged in a plurality of hierarchies with the transmission lines in the same hierarchy having electrical and physical characteristics that cause the signal propagation times through the transmission lines in the same hierarchy to be substantially equal to each other.

66. A method of coupling signals between a plurality of memory devices in a memory module and a register for storing address and command signals and outputting the stored address and command signals to the memory devices, the method comprising coupling a plurality of the signals between the register and the memory devices through a plurality of transmission lines in which each transmission line is connected at only its ends to either one of the memory devices or to an end of another of the transmission lines, the transmission lines being arranged in a plurality of hierarchies with the transmission lines in the same hierarchy having the same length.

67. The method of claim 66 wherein each of the transmission lines has a characteristic impedance, and wherein the act of coupling a plurality of the signals between the register and the memory devices through a plurality of transmission lines comprises coupling each of the signals between upstream transmission lines and downstream transmission lines in which the characteristic impedance of each downstream transmission line is twice the characteristic impedance of the upstream transmission line to which it is coupled.

68. The method of claim 66, further comprising coupling signals between the register and an additional memory device mounted on the memory module substrate other than the plurality of memory devices, the method comprising coupling each of a plurality of the signals between the register and the additional memory device through a respective dedicated transmission line that is not directly connected to any of the plurality of memory devices.

69. The method of claim 66 wherein the plurality of memory devices comprise $2^N$ of the memory devices, and wherein the act of coupling a plurality of the signals between the register and the memory devices through a plurality of transmission lines comprises arranging the transmission lines in N levels of hierarchy.

70. The method of claim 66 wherein the act of coupling a plurality of the signals between the register and the memory devices through a plurality of transmission lines comprises coupling a plurality of the signals between from the memory devices to the register through a plurality of transmission lines.

71. A method of coupling signals between an active memory component in a memory module and a plurality of memory devices in the memory module, the method comprising:
coupling a plurality of the signals between the active memory component and the memory devices through a plurality of transmission lines in which each transmission line is connected at only its ends to either one of the memory devices or to an end of another of the transmission lines, the transmission lines being arranged in a plurality of hierarchies with the transmission lines in the same hierarchy having the same length; and
coupling signals between the active memory component and an additional memory device mounted on the memory module substrate other than the plurality of memory devices, each of the signals being coupled between the active memory component and the additional memory device through a respective dedicated transmission line that is not directly connected to any of the plurality of memory devices.

72. The method of claim 71 wherein the lengths of the dedicated transmission lines provide substantially the same propagation time as the length of the transmission lines between the active memory component and the plurality of memory devices.

73. The method of claim 71 wherein the act of coupling a plurality of the signals between the active memory component and the memory devices through a plurality of transmission lines comprises coupling a plurality of the signals between from the memory devices to the active memory component through a plurality of transmission lines.

74. A method of coupling signals between an active memory component in a memory module and a plurality of memory devices in the memory module, the method comprising coupling a plurality of the signals between the active memory component and the memory devices through a plurality of transmission lines in which each transmission line has a characteristic impedance and is connected at only its ends to either one of the memory devices or to an end of another of the transmission lines, the transmission lines being arranged in a plurality of hierarchies with the transmission lines in the same hierarchy having electrical and physical characteristics that cause the signal propagation times through the transmission lines in the same hierarchy to be substantially equal to each other, the signals being coupled between the active memory component and the memory devices through the plurality of transmission lines by coupling each of the signals between upstream transmission lines and downstream transmission lines in which the characteristic impedance of each downstream transmission line is twice the characteristic impedance of the upstream transmission line to which it is coupled.

75. The method of claim 74 wherein the plurality of memory devices comprises a plurality of dynamic random access memory devices.

76. The method of claim 74, further comprising coupling signals between the active memory component and an additional memory device mounted on the memory module substrate other than the plurality of memory devices, the method comprising coupling each of a plurality of the signals between the active memory component and the additional memory device through a respective dedicated transmission line that is not directly connected to any of the plurality of memory devices.

77. The method of claim 74 wherein the act of coupling a plurality of the signals between the active memory component and the memory devices through a plurality of transmission lines comprises coupling a plurality of the signals between from the memory devices to the active memory component through a plurality of transmission lines.

78. A method of coupling signals between an active memory component in a memory module and a plurality of dynamic random access memory devices in the memory module, the method comprising coupling a plurality of the signals between the active memory component and the memory devices through a plurality of transmission lines in which each transmission line is connected at only its ends to either one of the memory devices or to an end of another of the transmission lines, the transmission lines being arranged in a plurality of hierarchies with the transmission lines in the same hierarchy having electrical and physical characteristics that cause the signal propagation times through the transmission lines in the same hierarchy to be substantially equal to each other.

79. The method of claim 78, further comprising coupling signals between the active memory component and an additional memory device mounted on the memory module substrate other than the plurality of memory devices, the method comprising coupling each of a plurality of the signals between the active memory component and the additional memory device through a respective dedicated transmission line that is not directly connected to any of the plurality of memory devices.

80. The method of claim 78 wherein the act of coupling a plurality of the signals between the active memory component and the memory devices through a plurality of transmission lines comprises coupling a plurality of the signals between from the memory devices to the active memory component through a plurality of transmission lines.

81. A method of coupling signals between an active memory component in a memory module and a plurality of memory devices in the memory module, the method comprising:
coupling a plurality of the signals between the active memory component and the memory devices through a plurality of transmission lines in which each transmission line is connected at only its ends to either one of the memory devices or to an end of another of the transmission lines, the transmission lines being arranged in a plurality of hierarchies with the transmission lines in the same hierarchy having electrical and physical characteristics that cause the signal propagation times through the transmission lines in the same hierarchy to be substantially equal to each other; and
coupling signals between the active memory component and an additional memory device mounted on the memory module substrate other than the plurality of memory devices, the method comprising coupling each of a plurality of the signals between the active memory component and the additional memory device through a respective dedicated transmission line that is not directly connected to any of the plurality of memory devices.

82. The method of claim 81 wherein the dedicated transmission lines have electrical and physical characteristics that cause the signal propagation times through the dedicated transmission lines between the active memory component and the additional memory device be substantially equal to the signal propagation times through the transmission lines between the active memory component and each of the plurality of memory devices.

83. The method of claim 81 wherein the act of coupling a plurality of the signals between the active memory component and the memory devices through a plurality of transmission lines comprises coupling a plurality of the signals between from the memory devices to the active memory component through a plurality of transmission lines.

84. A method of coupling signals between an active memory component in a memory module and a plurality of memory devices in the memory module, the method comprising coupling a plurality of the signals between the active memory component and the memory devices through a plurality of transmission lines in which each transmission line is connected at only its ends to either one of the memory devices or to an end of another of the transmission lines, the transmission lines being arranged in a plurality of hierarchies with the transmission lines in the same hierarchy having electrical and physical characteristics that cause the signal propagation times through the transmission lines in the same hierarchy to be substantially equal to each other, the plurality of the signals being coupled from the memory devices to the active memory component through a plurality of transmission lines.

* * * * *